(12) United States Patent
Lyding et al.

(10) Patent No.: US 6,444,533 B1
(45) Date of Patent: Sep. 3, 2002

(54) SEMICONDUCTOR DEVICES AND METHODS FOR SAME

(75) Inventors: Joseph W. Lyding; Karl Hess, both of Champaign, IL (US)

(73) Assignee: Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/518,802

(22) Filed: Mar. 3, 2000

Related U.S. Application Data

(62) Division of application No. 09/020,565, filed on Jan. 16, 1998, now Pat. No. 6,147,014, which is a continuation of application No. PCT/US97/00629, filed on Jan. 16, 1997, which is a continuation of application No. 08/586,411, filed on Jan. 16, 1996, now Pat. No. 5,872,387.

(51) Int. Cl.[7] .................. H01L 21/331; H01L 21/26
(52) U.S. Cl. .................. 438/308; 438/795; 438/910
(58) Field of Search ................. 438/257–267, 438/308, 795, 910

(56) References Cited

U.S. PATENT DOCUMENTS

| | | | |
|---|---|---|---|
| 3,849,204 A | * 11/1974 | Fowler | |
| 3,923,559 A | * 12/1975 | Sinha | |
| 4,027,380 A | 6/1977 | Deal et al. | 29/571 |
| 4,113,514 A | * 9/1978 | Pankove et al. | |
| 4,151,007 A | * 4/1979 | Levinstein et al. | |
| 4,290,825 A | * 9/1981 | Dearnaley et al. | |
| 4,331,486 A | * 5/1982 | Chenevas-Paule et al. | |
| 4,620,211 A | * 10/1986 | Baliga et al. | |
| 4,992,840 A | 2/1991 | Haddad et al. | 357/23.15 |
| 5,059,551 A | * 10/1991 | Chevallier et al. | |
| 5,162,892 A | 11/1992 | Hayashi et al. | 257/65 |
| 5,179,029 A | * 1/1993 | Gottscho et al. | |
| 5,248,348 A | * 9/1993 | Miyachi et al. | |
| 5,250,446 A | * 10/1993 | Osawa et al. | |
| 5,264,724 A | * 11/1993 | Brown et al. | 257/347 |
| 5,320,975 A | 6/1994 | Cederbaum et al. | 437/44 |
| 5,504,020 A | * 4/1996 | Aomori et al. | |
| 5,514,628 A | 5/1996 | Enomoto et al. | 437/247 |
| 5,571,339 A | * 11/1996 | Ringel et al. | |
| 5,693,961 A | * 12/1997 | Hamada | 257/66 |
| 5,872,387 A | * 2/1999 | Lyding et al. | 257/607 |
| 5,972,765 A | * 10/1999 | Clark et al. | 438/308 |
| 6,027,990 A | * 2/2000 | Thakur et al. | 438/533 |

FOREIGN PATENT DOCUMENTS

WO     WO-9419829     * 9/1994

OTHER PUBLICATIONS

Kizilyalli et al., "Deuterium Post–Metal Annealing of MOS-FET's for Improved Hot Carrier Mobility", IEEE Electron Device Letters, vol. 18,. No. 3, Mar. 1997, pp. 81–83.*

Wolf, "Silicon Processing for the VLSI Era vol. 2: Process Integration", p. 328, 1990, Lattice Press.*

Avouris et al., "STM–Induced H Atom Desorption From Si(100): Isotope Effects And Site Selectivity", Chemical Physics Letters, vol. 257, pp. 148–154 (Jul. 19, 1996).*

Ganguly et al., "Light–Induced Defect Densities in Hydrogenated and Deuterated Amorphous Silicon Deposited at Different Substrate Temperatures", Am. Phys. Soc., vol. 49, No. 16, pp. 10 986–10 990 (Apr. 15, 1994).*

Ipatova et al., "Effect of Localized Vibrations on the Si Surface Concentrations of H and D", J Appl. Phys., vol. 83, No. 2, pp. 814–819 (Jan. 15, 1998).*

(List continued on next page.)

*Primary Examiner*—Richard Booth
(74) *Attorney, Agent, or Firm*—Sharp, Comfort & Merrett, P.C.

(57) ABSTRACT

Described are preferred processes for conditioning semiconductor devices with deuterium to improve operating characteristics and decrease depassivation which occurs during the course of device operation. Also described are semiconductor devices which can be prepared by such processes.

8 Claims, 3 Drawing Sheets

OTHER PUBLICATIONS

Lyding et al., "Silicon Nanofabrication and Chemical Modification by UHV–STM", Mat. Res. Soc. Symp. Proc., vol. 380, pp. 187–197 (1995).*

Mikkelsen et al., "Seconday Ion Mass Spectroscopy Characterization of D2O and H2O Steam Oxidation of Silicon", J. Electronic Mat., vol. 11, No. 3, pp. 541–558 (1982).*

Myers et al., "Interactions of Deuterium With Ion–Irradiated SiO2 on Si", J. Appl. Physics, vol. 67, No. 9, pp. 4064–4071 (May 1, 1990).*

Park et al., "The Effect of Annealing Treatment On The Distribution of Deuterium in Silicon and Silicon/Silicon Oxide Systems", J. Electrochem. Soc., vol. 139, No. 7, pp. 2042–2046 (Jul. 1992).*

Saks et al., "The Time–Dependence of Post–Irradiation Interface Trap Build–Up in Deuterium Annealed Oxides", IEEE Transactions on Nuclear Science, vol. 39, No. 6, pp. 2220–2229, (Dec. 1992).*

Saks et al., "Time–Dependence of The Interface Trap Build–Up In Deuterium–Annealed Oxides After Irradiation", Appl. Phys. Lett., vol. 61, No. 25, pp. 3014–3016, Dec. 21, 1992.*

Shen et al., "Atomic–Scale Desorption Through Electronic and Vibrational Excitation Mechanisms", Science, vol. 268, pp. 1590–1592 (Jun. 1995).*

Zavada et al., "Optical Waveguides Formed by Deuterium Passivation of Acceptors in Si Doped p–type GaAs Epilayers", J. Appl. Physics, vol. 71, No. 9, pp. 4151–4155, May, 1992.*

Kizilyalli et al., "High Performance 3.3– and 5–V 0.5 Micron CMOS Technology for ASIC's", IEEE Transactions on Electron Devices, vol. 8, No. 4, Nov. 1995, pp. 440–447.*

D. Malacara, "Twyman–Greem Interferometer," Chap. 2 in *Optical Shop Testing*, 2nd Edtion, D. Malacara, Ed., pp. 51–94, John Wiley & Sons, New York (1992).

D. Malacara amd S. L. DeVore, "Interferogram Evaluation and Wavefront Fittimg," Chap. 13 in *Optical Shop Testing*, 2nd Edition, D. Malacara, Ed., pp. 461–472, John Wiley & Sons, New York (1992).

K. Creath and A. Morales, "Contact and Noncontact Profilers," Chap. 17 in *Optical Shop Testing*, 2nd Edtion, D. Malacara, Ed., pp. 700–703, John Wiley & Sons, New York (1992).

* cited by examiner

SEMICONDUCTOR DEVICES AND METHODS FOR SAME

This application is a divisional of application Ser. No. 09/020,565 filed Jan. 16, 1998 (U.S. Pat. No. 6,147,014) which is a continuation of International Application PCT/US97/00629 filed Jan. 16, 1997 which is a continuation of Application 08/586,411 filed Jan. 16, 1996 (U.S. Pat. No. 5,872,387).

BACKGROUND OF THE INVENTION

The present invention resides in the field of semiconductor devices, and in particular relates to methods for treating semiconductor devices or components thereof in order to reduce the degradation of semiconductor device characteristics over time.

As further background, hydrogen passivation has become a well-known and established practice in the fabrication of semiconductor devices. In the hydrogen passivation process, defects which affect the operation of semiconductor devices are removed. For example, such defects have been described as recombination/generation centers on active components of semiconductor devices. These centers are thought to be caused by dangling bonds which introduce states in the energy gap which remove charged carriers or add unwanted charge carriers in the device, depending in part on the applied bias. While dangling bonds occur primarily at surfaces or interfaces in the device, they also are thought to occur at vacancies, micropores, dislocations, and also to be associated with impurities.

Over the years a number of hydrogen passivation processes have been proposed. For example, U.S. Pat. No. 3,923,559 describes a process in which, in the fabrication of a device such as a metal oxide semiconductor field effect transistor (MOSFET) device, hydrogen gas is introduced into the layer of silicon dioxide prior to deposition of the metal electrodes. Thereafter, the metal electrodes are deposited, thereby trapping the hydrogen gas within the device. Thereafter, the device is annealed at an elevated temperature and the hydrogen previously introduced migrates to the silicon surface to neutralize undesirable interface states produced during device fabrication.

U.S. Pat. No. 4,151,007 describes a passivation process in which the last fabrication step in the device fabrication involves heating the device in an ambient of hydrogen gas at a temperature of 650° C. to 950° C. This final hydrogen anneal step reportedly negated the effects of slow trapping and thus improved the stability of the MOS structures.

U.S. Pat. No. 4,113,514 describes a passivation process which involves exposing the device to atomic hydrogen, for example generated using a glow-discharge apparatus acting upon molecular hydrogen, at a temperature lower than 450° C. Somewhat similarly, U.S. Pat. No. 4,331,486 describes a passivation process in which a hydrogen plasma is created to treat the semiconductor devices with atomic hydrogen.

U.S. Pat. No. 3,849,204 describes a passivation process which involves implanting hydrogen ions in the area of defects, and thereafter annealing the substrate in an inert atmosphere to eliminate the interface states.

Another problem which has arisen in the semiconductor industry is the degradation of device performance by hot carrier effects. This is particularly of concern with respect to smaller devices in which proportionally larger voltages are used. When such high voltages are used, channel carriers can be sufficiently energetic to enter an insulating layer and degrade device behavior. For example, in silicon-based P-channel MOSFETs, channel strength can be reduced by trapped energetic holes in the oxide which lead to a positive oxide charge near the drain. On the other hand, in N-channel MOSFETs, gate-to-drain shorts may be caused by electrons entering the oxide and creating interface traps and oxide wear-out. "Drain engineering" has been an emerging field attempting to cope with these problems, for example involving the use of a lightly-doped drain (LDD) in which a lightly-doped extension of the drain is created between the channel and the drain proper. For additional detail as to these and other potential measures for reducing susceptibility to hot carrier effects, reference can be made for example to U.S. Pat. Nos. 5,352,914, 5,229,311, 5,177,571, 5,098,866, 4,859,620, 4,691,433 and 4,521,698. Such solutions are, however, expensive because they typically complicate the fabrication process. Their avoidance, or at least their simplification, would be desirable.

In light of this background there exists a need for improved passivation processes and devices resulting from such processes. The present invention addresses these needs.

SUMMARY OF THE INVENTION

It has been discovered that semiconductor devices, for example including MOS devices, can be advantageously treated with deuterium to improve their operational characteristics. Accordingly, one preferred embodiment of the present invention provides a method for treating a semiconductor device which includes a step of passivating the device with deuterium. Semiconductor devices so passivated also form a part of the present invention.

In a more preferred aspect, the invention provides a semiconductor device which includes a semiconductor layer including a Group III, IV or V element, or a mixture thereof. The device also includes an insulative (dielectric) layer atop the semiconductor layer, wherein deuterium atoms are covalently bound to atoms of the Group III, IV or V element in amounts sufficient to significantly increase resilience of the device to hot carrier effects.

Additional embodiments of the invention provide processes in which deuterium-treated semiconductor devices of the invention are operated under conditions which produce hot carrier effects, and in which deuterium is introduced into the semiconductor device after fabrication is complete, and/or in one or more of a variety of fabrication steps, and the introduced deuterium is used to improve the operative characteristics of the device.

Methods and devices of the invention provide unique advantages in the field of semiconductors, their preparation and their use. For example, the provided device demonstrate improved operational characteristics and resist aging or "depassivation" due to hot-carrier effects. Moreover, devices of the invention can be operated using higher voltages to increase performance, while better resisting degradation due to hot-carrier effects. Likewise, methods of the invention are beneficial for preparing radiation hard devices, which are usually operated at higher voltages. Further, methods of the invention can be readily and economically practiced and incorporated into existing fabrication techniques, and may eliminate the need for costly and/or complicated measures otherwise taken to guard against hot electron effects, for example lightly doped drain (LDD) technology, or provide more processing flexibility in the conduct of such measure.

Additional objects, features and advantages of the invention will be apparent from the following description.

DESCRIPTION OF THE PREFERRED EMBODIMENTS

Figure 1:
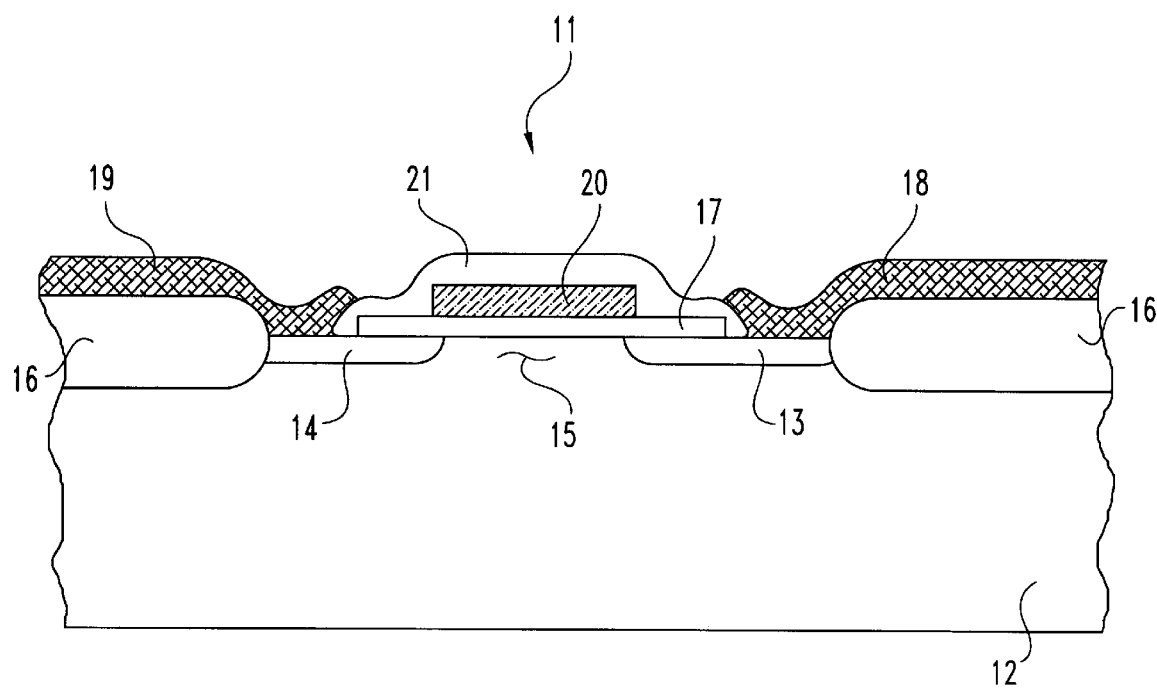
FIG. 1 is a diagram of one illustrative metal oxide semiconductor field effect transistor to which the present invention can be applied.

For the purposes of promoting an understanding of the principles of the invention, reference will now be made to embodiments thereof and specific language will be used to describe the same. It will nevertheless be understood that no limitation of the scope of the invention is thereby intended, such alterations, further modifications and applications of the principles of the invention as described herein being contemplated as would normally occur to one skilled in the art to which the invention pertains.

As disclosed above, preferred embodiments of the present invention involve the use of deuterium in the fabrication of semiconductor devices and components thereof. It has been discovered that semiconductor devices can be advantageously treated with deuterium to dramatically improve their operational characteristics. For example, treatment with deuterium provides a reduction in the depassivation or "aging" of semiconductor devices due to hot-carrier effects. Such aging is evidenced, for example, by substantial degradations of threshold voltage, transconductance, or other device characteristics. In accordance with the present invention, semiconductor devices are fabricated using deuterium to condition the devices and stably reduce the extent of these degradations. This can be accomplished, for instance, by disposing molecular ($D_2$), atomic (°D) or ionic ($D^+$) deuterium in the areas of the device in which protection against hot carrier effects is desired, and causing the deuterium to covalently bond with atoms in the area so as to be stably incorporated, for example bonding to atoms of a semiconductor layer. This covalent bonding can conveniently be achieved by heating. In these regards, the particular modes by which the deuterium is provided to the desired area, e.g. by diffusion of molecular (gaseous) deuterium or implantation of atomic or ionic deuterium, and is caused to be covalently bonded in the desired area, are not critical to the broad aspects of the present invention.

Similarly, the present invention is applicable to a broad range of semiconductor devices and their fabrication processes. Generally speaking the semiconductor devices will include at least one active component therein, for example a diode, transistor, thyristor or the like. Illustrative examples include MOS-based devices such as MOSFET devices, including CMOS and NMOS technology, light-emitting diodes, laser diodes, and the like. In this regard, the MOS-based technology discussed herein is intended to encompass the use of gate conductors other than metals as is commonly practiced, and thus reference to MOS-based devices encompasses other insulated gate technologies (e.g. IGFETs). While aspects of the present invention will now be described in more detail with reference to MOSFETs (i.e. IGFETs), it will be understood that the invention is applicable to the above-mentioned and other semiconductor devices which are susceptible to aging due to hot-carrier effects and generally the effects of energetic charge carriers.

Referring now to FIG. 1, shown is a diagram of an illustrative MOSFET to which the present invention can be applied. The device 11 includes a semiconductive substrate 12, for example comprising one or more members selected from Group III, IV or V of the periodic table. The semiconductive substrate can be a p- or n-type substrate and can, for instance, be doped or undoped crystalline silicon or amorphous silicon, gallium arsenide, or gallium aluminum arsenide. The device 11 also includes a drain 13 (n- or p-type, depending on the type of substrate) and a source 14 (similarly n- or p-type) formed in the substrate 12, and a channel 15 extending therebetween. A field oxide or other electrically insulative (dielectric) layer 16 is also provided, as is a gate insulator (dielectric) 17. Insulators 16 and 17 can be formed of a single layer or of multiple layers, and can include for instance an oxide and/or nitride of silicon, e.g. a silicon dioxide, silicon nitride, silicon oxy nitride, or silicon-rich oxide film. Device 11 also includes conductive contacts 18, 19 and 20 for the drain 13, source 14 and gate insulator 17, which can include one or more conductive materials such as metals, e.g. aluminum, gold, or copper; metal suicides such as tungsten, molybdenum, tantalum or titanium silicide, or combinations thereof; polysilicon; and titanium nitride. These and other electrically conductive materials are known in the art and can be used in the present invention. The illustrated device is typical of a MOSFET employing a polysilicon gate contact, and includes an insulator 21 over the gate contact 20. The general fabrication techniques for semiconductor devices of the invention can be conventional, including conventional growth or deposition of various layers and doping operations employing appropriate masks, encapsulation, packaging and other steps.

In accordance with the invention, the semiconductor device will be treated with deuterium during or after completion of fabrication so as to condition the device to improve its operating characteristics. In the case of MOSFET devices, such improvement is thought to occur due to the elimination of interface states between the semiconductor substrate 12 (e.g. silicon) and the gate insulator 17 (e.g. silicon dioxide) by covalent bonding of deuterium atoms at the interface. Therefore, in preferred aspects of the present invention, during or subsequent to the fabrication of device 11 (e.g. subsequent to fabricating the gate, source and drain contacts), deuterium, either in atomic, ionic or molecular form, is disposed at the interface of the substrate 12 and the gate insulator 17, and caused to covalently bond to atoms at the interface, for instance atoms at the surface of the semiconductor layer.

In this regard, deuterium conditioning or passivation of the device 12 can be achieved in a variety of ways. For instance, device 11 can be heated in the presence of a flowing, mixed or static deuterium-enriched ambient at one or more stages of fabrication, and/or after fabrication is completed (i.e. after the metal contacts are completed). The deuterium-enriched ambient in accordance with the invention will contain deuterium at a level above that which occurs in nature, and above that which occurs as a low-level impurity in other supplied gases (for example purified hydrogen gas which is presently used in hydrogen passivation processes for semiconductors). Generally speaking, ambients containing 0.1% up to 100% by volume deuterium gas will be employed, more preferably about 5% to 50%, and conveniently about 5% to 20%. The deuterium-enriched ambient will preferably be completely or essentially free of oxygen, but can contain one or more other gases useful in or not deleterious to the annealing procedure. For example, hydrogen gas can be used in combination with deuterium, and/or inert gases such as nitrogen, helium, argon or the like can be present. The annealing process can be conducted at atmospheric, subatomospheric or superatmospheric pressure, preferably at a temperature of at least about 200° C. up to the melting or decomposition temperature of other components of the device, more preferably in the range of about 200° C. to about 1000° C., and most typically in the range of about 200° C. to about 800° C. In addition, once processing in the ambient is complete, the deuterium remaining in the ambient can be recovered for recycle and later use. For instance, the ambient can be combusted so as to form heavy water ($D_2O$), and the heavy water processed (e.g. by electrolysis or otherwise) to again from deuterium gas.

Other methods of providing deuterium at the semiconductor/gate insulator interface, or in other areas of a semiconductor device where a reduction in the degradation of device performance by hot carrier effects, may also be used without departing from the present invention. For example, atomic deuterium can be disposed at the desired location (e.g. interface) by ion or atomic deuterium implantation and annealing techniques (see e.g. U.S. Pat. Nos. 3,849,204 and 4,113,514) and/or can be trapped within layers of the semiconductor device during fabrication and thereafter caused to migrate to the interface (see e.g. U.S. Pat. No. 3,923,559). Moreover, during the initial stages of fabrication, the surface of the semiconductive substrate 12 can be conditioned to contain covalently bonded deuterium, for example by etching with a deuterium halide such as deuterium bromide, chloride or fluoride or by treatment with a deuterium plasma. The substitution of such treatments for those currently practiced, for instance hydrogen fluoride or bromide etching or hydrogen plasma treatment, will be well within the purview of those practiced in the field of semiconductor device fabrication. Such treatment will desirably result in deuterium atoms being covalently bonded to the surface atoms of the material from which the semiconductor is constructed (e.g. a Group III, IV or V element or mixture thereof), for example being directly bonded to atoms of such material (e.g. in the case of a Si—D bond), or bonded to such atoms through oxygen or another atom (e.g. in the case of an Si—O—D covalent bonding). Thus, in the case of a silicon semiconductor, such surface treatment processes will desirably populate the surface of the semiconductor with deuterium-silicon (D—Si) and/or deuterium-oxygen-silicon (D—O—Si) bonds. The treated semiconductor material can then be used to fabricate a semiconductor device.

Additional treatments which involve the substitution of a deuterium-containing compound for a hydrogen-containing compound in device fabrication include, for instance, the use of deuterated compounds in the formation of silicon nitride ($Si_3N_4$) spacers which act as diffusion barriers. Conventionally, ammonia ($NH_3$) is reacted with an appropriate silane compound such as silane ($SiH_4$), disilane ($Si_2H_6$), or dichlorosilane ($SiCl_2H_2$) to manufacture such silicon nitride spacers. In specific aspects of the present invention, silicon nitride spacers can be manufactured from corresponding chemicals in which one or more of the hydrogens, and preferably all of the hydrogens, are replaced by deuterium. Thus, a silicon nitride spacer can be formed by reacting a compound having the formula $ND_{(n)}H_{(3-n)}$ wherein n is 1, 2 or 3, with an appropriate silane compound, e.g. $SiD_{(m)}H_{(4-m)}$ wherein m is 1, 2, 3 or 4, or $Si_2D_oH_pX_q$ wherein o is 1, 2, 3, 4, 5 or 6, p is 0, 1, 2, 3, 4 or 5, q is 0, 1, 2, 3, 4 or 5, and X is halogen such as bromo- or chloro-, with the proviso that o+p+q=6. Among these, it will be preferred to react $ND_3$ with $SiD_4$ and/or $SiCl_2D_2$ to form the silicon nitride spacer. Constructing the nitride spacer in this fashion will leave a deuterium-containing background, which will provide a deuterium source in the device which is released, e.g. during heat treatment, to passivate the oxide/silicon interface in MOS transistors or other similar devices. Appropriate chemicals for these purposes may be obtained commercially and/or manufactured using techniques generally known to the art. For instance, deuterated ammonia ($ND_3$) is available commercially from Isotech, Inc. of Miamisburg, Ohio. Deuterated silane ($ND_4$) can be prepared by reacting tetrachlorosilane ($SiCl_4$) with lithium aluminum deuteride ($LiAlD_4$) to form the deuterated silane (see, e.g. *Journal of Organometallic Chemistry*, Vol. 18, p. 371 (1969); and *Inorganic Synthesis*, Vol. 11, pp. 170–181 (1968)). Lithium aluminum deuteride for such reactions can be prepared using known procedures or can be obtained commercially from Isotech, Inc. Dideuterodichlorosilane ($D_2SiCl_2$) may be prepared by reacting silicon metal (Si) with deuterium chloride (DCl) to form deuterotrichlorosilane ($DSiCl_3$), which can in turn be reacted in the presence of a catalyst to form dideuterodichlorosilane (see, e.g., *Ind. Eng. Chem. Res.* 27(9), 1600–1606 (1988). These and other appropriate chemistries for preparing deuterated compounds will be readily apparent to the skilled artisan.

Still other fabrication steps which conventionally employ hydrogen-containing chemicals, and for which corresponding deuterium-containing chemicals can be used, include the growth of oxides using DCl instead of HCl to remove metal impurities, the growth of oxynitrides with deuterated ammonia, e.g. $ND_3$, instead of $NH_3$, the manufacture of polysilicon gates made with a deuterated silane or related compounds, the manufacture of epitaxial silicon layers made with deuterated silane or related compounds, wet oxidation processes using $D_2O$ in place of $H_2O$, and the use of deuterated dopants such as $AsD_3$, $PD_3$, $B_2D_6$, or the like. These and other similar processes can be used to provide a deuterium-containing background in the device, which will release deuterium to condition the semiconductor device.

Techniques described herein other than annealing in a gaseous deuterium ambient, e.g. those which involve ion implantation and/or entrapment of deuterium during fabrication for later migration and passivation, can effectively facilitate passivation where structures are contained in the device which hinder the passage of deuterium gas to the interface of the semiconductor and insulative layer. For example, the presence of silicon nitride layers above the interface hinders the diffusion of deuterium gas to the interface, and thus the use of alternate or additional methods of providing deuterium to the interface, as described above, can optionally be used to facilitate device passivation.

The conditioning of the semiconductor device with deuterium has been found to significantly reduce effects associated with depassivation of the device by hot-carrier (e.g. hot-electron) effects. For example, as reported in the Experimental below, dramatic decreases in the degradation of threshold voltage and transconductance are observed when deuterium is used to passivate the devices, as compared to hydrogen passivation (see FIGS. 2 and 3, respectively). These decreases represent practical lifetime improvements by factors of about ten to fifty, and also make possible the operation of the semiconductor devices at higher voltages while better resisting aging due to hot electron effects.

In order to promote a further understanding and appreciation of the present invention and its advantages, the following experimental is provided. It will be understood that this experimental is illustrative, and not limiting, of the invention.

EXPERIMENTAL

1. MATERIALS AND EQUIPMENT 1.1 Wafers

The wafers used in these examples contained NMOS transistor structures fabricated using AT&T's 0.5 μm 3.3 volt CMOS technology generally as described in I. C. Kizilyalli and M. J. Thoma, et al., IEEE Trans. Semiconductor Manufacturing 8, 440 (1995), with the following changes. The gate oxide was reduced to $t_{ox}$~55 Å, the doping in the p-well was increased, and the phosphorous-doped LDD region was replaced by a shallow arsenic implanted (dose=$4 \times 10^{14}$ cm$^{-2}$ at 30 keV) source-drain extension region. With these modifications, the peak value for the source-drain peak electric field near the drain edge of the gate is enhanced, resulting in more channel hot electrons. The shallow source-drain extension insures that these hot electrons are near the Si/SiO$_2$ interface, where they will cause significant interface damage. The interface damage, caused by these hot carriers, can easily be observed by monitoring the changes in NMOS transistor transconductance (i.e. $g_m = \Delta I_{DS}/\Delta V_{GS}|V_{DS}$) or by the shift in transistor threshold voltage $V_{th}$. See, J. M. Pembley et al in Advanced CMOS Process Technology, VLSI Electronics Microstructure Science, Vol. 19, Academic Press: San Diego, 1989.

1.2 Gases

Hydrogen, nitrogen and deuterium gases were obtained from S. J. Smith Welding Supply, Decatur, Ill., U.S.A. All gases were ultra high purity (UHP), 99.999% pure. The source of the deuterium gas was MG Industries of Morrisville, Pa., U.S.A.

1.3 Furnace Set-Up

Wafers were annealed using a two-zone Marshall muffle furnace set up for feed of nitrogen and either hydrogen or deuterium through the zones. Wafers were positioned on a sliding quartz tray and positioned with a quartz pushrod. Both zones of the furnace were set to the desired annealing temperature and then the rheostats of the wafer annealing zones were adjusted to achieve substantially constant temperature: across the holding area of the quartz tray. This tray was positioned the same for each run. Temperatures were measured using a type K thermocouple fed into the furnace through an O-ring sealed stainless steel feedthrough on the furnace tube insert end caps. Another type K thermocouple was placed in an ice bath (deionized water) to serve as the zero 0° C. reference. The temperature between the two thermocouples was measured using a PROTEK TM BOOK battery operated thermocouple meter. The furnace zones were connected to two Barber Coleman 570 temperature controllers which used the fixed thermocouples (10.5 inches from the furnace ends) for feedback. For gas flow, the ends of the furnace quartz tube insert were tapered ground glass joints for which mating glass end caps were fashioned. Because the ends of the tubes were well outside of the furnace, they were not hot and a gas tight seal could easily be formed using Teflon tape. A cylinder containing the hydrogen or deuterium was connected to the furnace gas tube with a Matheson Model 3122-350 two stage regulator with a metal diaphragm to preserve gas purity. The gases were plumbed to the quartz tube end cap by means of 304 stainless steel tubing. The nitrogen gas line was interfaced to the glass end cap by means of an O-ring sealed stainless steel quick connector. The hydrogen and deuterium gas lines shared a similar connector, with only one of these gases being connected at any given time to avoid the possibility of cross-contamination between the hydrogen and deuterium lines. As a further precaution, the deuterium gas line contained a series coil of copper tubing which was immersed in liquid nitrogen to remove any moisture that might otherwise introduce hydrogen into the furnace. During the anneal runs, the gas flowed through the zone of the furnace which did not contain the wafer samples before entering the wafer zone. In this manner, the gas was preheated, thereby not perturbing the wafer zone temperature. After exiting the wafer zone, the gas flowed out through a fitting on the opposite end cap and was then routed through a Matheson P6-1000 series flowmeter (0.1 through 2.0 standard liters per minute (SLPM) range). After the flowmeter, the gas was exhausted through a standard hood vent.

2. ANNEALING RUNS

In all runs, nitrogen gas flow was set at 0.55 SLPM. To achieve an ambient containing about 10% by volume hydrogen or deuterium gas, the pressure was increased to about 0.61 SLPM by opening the hydrogen or deuterium gas regulator. In a first run, wafer samples were annealed in an ambient of 10% deuterium in nitrogen for a period of about 1 hour. The temperature was maintained at about 400° C. In a second run, wafer samples were annealed in a 10% by volume hydrogen in nitrogen ambient for a period of about 1 hour at a temperature of about 400° C. Devices on the resulting wafers were subjected to electrical stress testing. In particular, accelerated hot carrier DC stress experiments were performed on transistors with varying gate lengths (0.5 μm to 15 μm) at peak substrate current conditions. The applied stress voltages were $V_{DS}$=5V and $V_{GS}$~2V. Pre-stress transistor measurements demonstrate that devices sintered in hydrogen and deuterium have identical electrical characteristics (e.g. transconductance, threshold voltage, substhreshold-slope, saturation current, and the like).

Figure 2:
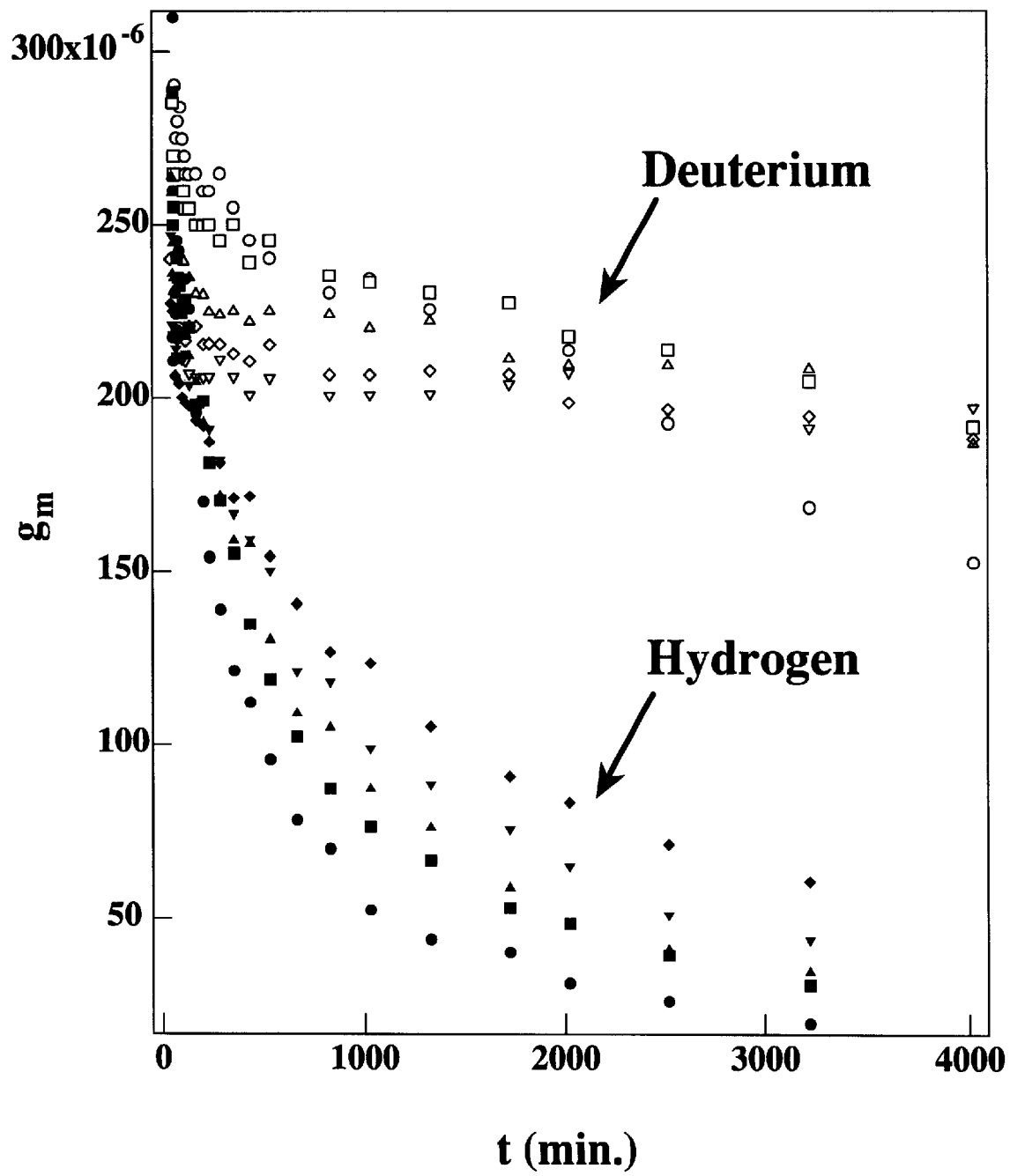
FIG. 2 is a graph illustrating the comparative time-dependent degradation of the transconductance for five NMOS transistors sintered in hydrogen (solid symbols) and deuterium (open symbols), as discussed in the Experimental.
Figure 3:
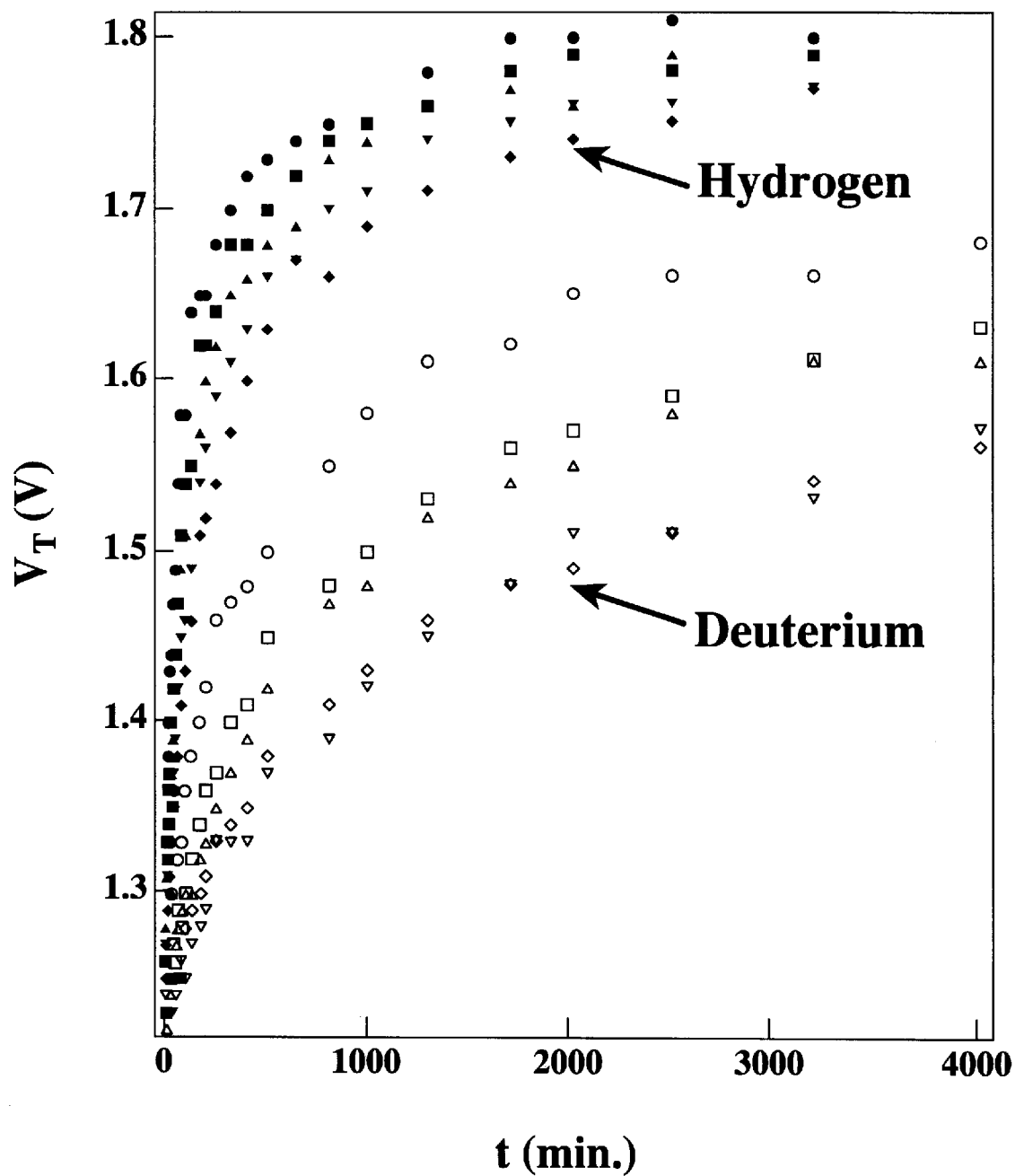
FIG. 3 is a graph illustrating the comparative time-dependent increase of the threshold voltage for NMOS transistors sintered in hydrogen (solid symbols) and deuterium (open symbols), as discussed in the Experimental.

FIG. 2 shows the transconductance degradation as a function of stress time for NMOS transistors with five gate lengths ranging from 0.5 to 0.7 μm. In FIG. 3 the threshold voltage increase as a function of stress time is shown for the same devices. As can been seen, wafers sintered in a deuterium ambient exhibit dramatically higher levels of resilience to channel hot carrier stress. In further comparative study, about 80 additional transistors were similarly stressed, and the same strong trend was observed. These results show that if 20% transconductance degradation is taken as a practical lifetime criteria, transistors sintered in deuterium typically exhibit lifetimes 10 times longer than those sintered in hydrogen. A factor of 10 improvement in lifetime is also inferred if a shift of 100 mV (or 200 mV) in threshold voltage is taken as the degradation criteria.

While the invention has been illustrated and described in detail in the foregoing description, the same is to be considered as illustrative and not restrictive in character, it being understood that only the preferred embodiments have been described and that all changes and modification that come within the spirit of the invention are desired to be protected. In addition, all publications cited herein are indicative of the level of skill in the art and are hereby incorporated by reference as if each had been individually incorporated by reference and fully set forth.

What is claimed is:

1. A process for treating a semiconductor device including a semiconductor region and an insulating layer having an interface with the semiconductor region and a contact on said insulating layer overlying said interface, comprising the steps of forming said insulating layer with a thickness not exceeding about 55 Angstroms beneath said contact, and of annealing said semiconductor device, subsequent to completion of fabrication of said device, in an ambient including deuterium to form a concentration of deuterium at the interface between said semiconductor region and said insulating layer region effective to substantially reduce degradation of said device associated with hot carrier stress.

2. A process for treating an insulated gate field effect transistor device structure including a channel region extending between source and drain regions, a gate insulating layer having an interface with said channel region, and contacts to said source and drain regions and on said gate insulator layer, comprising forming said gate insulator beneath the gate contact to have a thickness not greater than about 55 Angstroms and, subsequent to formation of said source, drain and gate contacts, annealing the device in an ambient including deuterium at a temperature above about 200° C. and below a decomposition or melting temperature of said structure to form a concentration of deuterium at said interface region effective to substantially reduce degradation of said device associated with hot carrier stress by increasing a practical lifetime at least about 10 times that provided by a corresponding passivation with hydrogen, where practical lifetime is taken as 20% transconductance degradation as a result of electrical stress.

3. A process according to claim 2, wherein said temperature is about 400° C.

4. The method of claim 1 wherein said deuterium-enriched ambient comprises deuterium gas and one or more inert gases.

5. The method of claim 4 wherein said ambient includes 1% to 100% by volume deuterium gas.

6. The method of claim 1 wherein said ambient comprises deuterium gas and one or more of hydrogen, nitrogen, argon, and helium gas.

7. The method of claim 1 wherein said insulative layer comprises an oxide or nitride of silicon.

8. The method of claim 1, which comprises annealing said device at a temperature of at least about 400° C.

* * * * *

UNITED STATES PATENT AND TRADEMARK OFFICE
CERTIFICATE OF CORRECTION

PATENT NO. : 6,444,533 B1
DATED : September 3, 2002
INVENTOR(S) : Joseph W. Lyding et al.

It is certified that error appears in the above-identified patent and that said Letters Patent is hereby corrected as shown below:

Column 1,
Line 4, immediately after the title, please insert the following new paragraph:

-- GOVERNMENT RIGHTS
This invention was made with government support under Grant No. N00014-92-J-1519 awarded by the Department of Navy Research. The government has certain rights in the invention. --

Signed and Sealed this

Third Day of August, 2004

JON W. DUDAS
*Acting Director of the United States Patent and Trademark Office*